United States Patent
Mitchell et al.

(10) Patent No.: US 9,257,440 B2
(45) Date of Patent: *Feb. 9, 2016

(54) NON-VOLATILE ANTI-FUSE WITH CONSISTENT RUPTURE

(71) Applicant: Texas Instruments Incorporated, Dallas, TX (US)

(72) Inventors: Allan T. Mitchell, Heath, TX (US); Mark A. Eskew, Carrollton, TX (US); Keith Jarreau, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,493

(22) Filed: May 2, 2014

(65) Prior Publication Data
US 2014/0239409 A1    Aug. 28, 2014

Related U.S. Application Data

(62) Division of application No. 13/569,730, filed on Aug. 8, 2012, now Pat. No. 8,748,235, which is a division of application No. 13/045,725, filed on Mar. 11, 2011, now Pat. No. 8,258,586.

(51) Int. Cl.
*H01L 27/112* (2006.01)
*G11C 17/16* (2006.01)
*H01L 29/49* (2006.01)
*H01L 29/861* (2006.01)

(52) U.S. Cl.
CPC .......... *H01L 27/11206* (2013.01); *G11C 17/16* (2013.01); *H01L 27/11226* (2013.01); *H01L 29/4983* (2013.01); *H01L 29/861* (2013.01)

(58) Field of Classification Search
CPC ............ H01L 27/11206; H01L 29/861; H01L 29/4983
USPC .................................. 257/528–530
See application file for complete search history.

(56) References Cited

U.S. PATENT DOCUMENTS

2012/0211832 A1* 8/2012 Chu et al. .............. H01L 29/402
257/335

* cited by examiner

*Primary Examiner* — Tran Tran
(74) *Attorney, Agent, or Firm* — John R. Pessetto; Frank D. Cimino

(57) ABSTRACT

In an embodiment of the invention, a non-volatile anti-fuse memory cell is disclosed. The memory cell consists of a programmable n-channel diode-connectable transistor. The poly-silicon gate of the transistor has two portions. One portion is doped more highly than a second portion. The transistor also has a source with two portions where one portion of the source is doped more highly than a second portion. The portion of the gate that is physically closer to the source is more lightly doped than the other portion of the poly-silicon gate. The portion of the source that is physically closer to the lightly doped portion of the poly-silicone gate is lightly doped with respect to the other portion of the source. When the transistor is programmed, a rupture in the insulator will most likely occur in the portion of the poly-silicone gate that is heavily doped.

2 Claims, 5 Drawing Sheets

NON-VOLATILE ANTI-FUSE WITH CONSISTENT RUPTURE

CROSS-REFERENCED TO RELATED APPLICATION

This application is a divisional of prior application Ser. No. 13/569,730, filed Aug. 8, 2012, currently pending;

Which is a divisional application of prior application Ser. No. 13/045,725, filed on Mar. 11, 2011, now U.S. Pat. No. 8,258,586, granted Sep. 4, 2012, the entire disclosure of which is incorporated herein by reference.

BACKGROUND

A programmable read-only memory (PROM), a field programmable read-only memory (FPROM), and a one-time programmable non-volatile memory (OTP NVM) are forms of digital memory where the setting of each bit is locked by a fuse or an anti-fuse. These PROMs may be used to store programs permanently. One difference between a read-only memory (ROM) and a PROM is that with a PROM the programming is applied after the device is constructed.

PROMs are often manufactured blank and depending on the technology can be programmed on a wafer, during final test, or in a system. The availability of this technology allows companies to maintain a supply of blank PROMs in stock, and program them at the last minute to avoid a large volume commitment. These types of memories are frequently seen in video game consoles, mobile phones, radio-frequency identification tags, implantable medical devices, high-definition multimedia interfaces and in many other consumer and automotive electronic products.

An anti-fuse is an electrical device that performs the opposite function to a fuse. A fuse starts with a low resistance. When a fuse is "blown" (a blown fuse typically occurs when the current through the low resistance path exceeds a specified current limit), a permanent break (open) in the previously electrically conductive path occurs. An anti-fuse starts with a high resistance and is designed to permanently create an electrically conductive path. For example, an anti-fuse may consist of a thin gate oxide transistor laid out in such a way that when the thin gate oxide is ruptured (programmed), a channel diode-connected transistor is formed between a word line and a bit line. The thin gate oxide is ruptured by applying a high voltage on the gate of the channel diode-connected transistor.

When an anti-fuse is programmed, the rupture may occur in a location on the thin gate oxide that shorts a word line to a bit line instead of forming a channel diode-connected transistor between the word line and the bit line. In another example, when an anti-fuse is programmed, the rupture may occur in a location on the thin gate oxide that creates a highly resistive gate-to-drain diode connection rather than a low resistance gate-to-drain connection for the channel diode-connected transistor that is desired. Therefore, it is important that the rupture occur at a location on the thin gate oxide that creates a low resistance gate-to-drain diode connection for the channel diode-connected transistor.

DETAILED DESCRIPTION

The drawings and description, in general, disclose a non-volatile anti-fuse memory cell. In one embodiment, the memory cell consists of a one-time-programmable n-channel diode-connectable transistor. The poly-silicon gate of the transistor in this example has two portions. One portion is doped more highly than a second portion of the gate. The dopant used in this example is an n-type dopant. The transistor also has a source with two portions where one portion of the source is doped more highly than a second portion of the source. In this example, the source is doped using an n-type dopant as well.

In this embodiment of the invention, the portion of the gate that is physically closer to the source is more lightly doped than the other portion of the poly-silicon gate. The portion of the source that is physically closer to the lightly doped portion of the poly-silicone gate is lightly doped with respect to the other portion of the source. When the transistor is programmed (e.g. applying 6 volts on the gate and 0 volts on the source), a rupture in the oxide will most likely occur in the portion of the poly-silicone gate that is heavily doped.

When the gate is uniformly doped, the rupture may also occur near the source. When a rupture occurs near the source, a word line and bit line may be shorted. In this example, shorting a word line to a bit line will cause the cell to fail and increase the power used on the integrated circuit where the transistor is located. This type of failure will be discussed in more detail.

Figure 1:
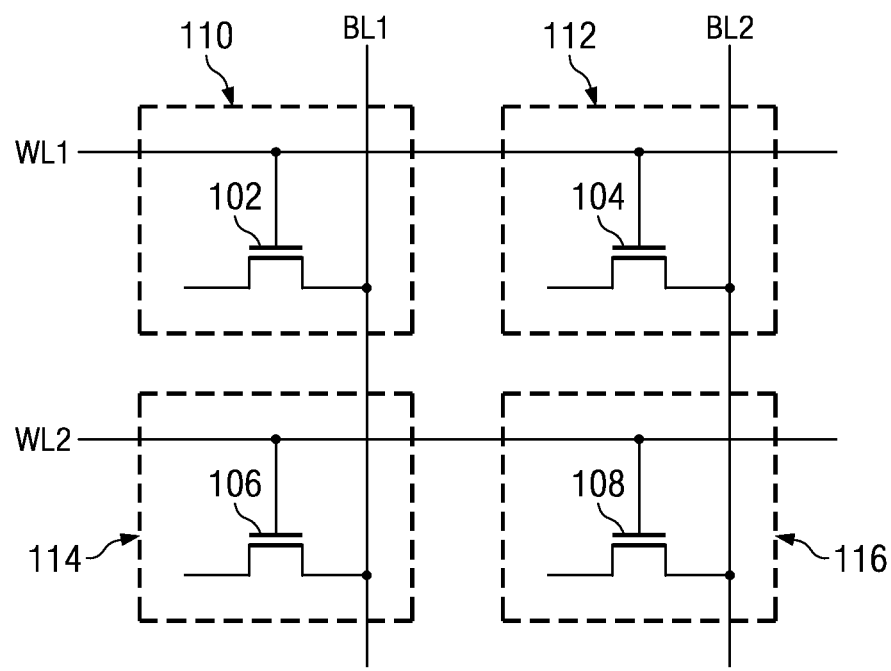
FIG. 1 is a schematic drawing of an embodiment of four programmable non-volatile anti-fuse memory cells.

FIG. 1 is a schematic drawing of an embodiment of four programmable non-volatile anti-fuse memory cells. Each memory cell 110, 112, 114, 116 contains a one-time-programmable n-channel diode-connectable transistor, 102, 104, 106 108 respectively. The sources of transistors 102 and 106 are electrically connected to bit line BL1 while the sources of transistors 104 and 108 are electrically connected to bit line BL2. The gates of transistors 102 and 104 are electrically connected to word line WL1 while the gates of transistors 106 and 108 are electrically connected to word line WL2. The one-time-programmable n-channel diode-connectable transistors 102, 104, 106 108 shown in FIG. 1 have not been programmed. Because they have not been programmed, transistors 102, 104, 106 and 108 do not have drains.

Figure 2:
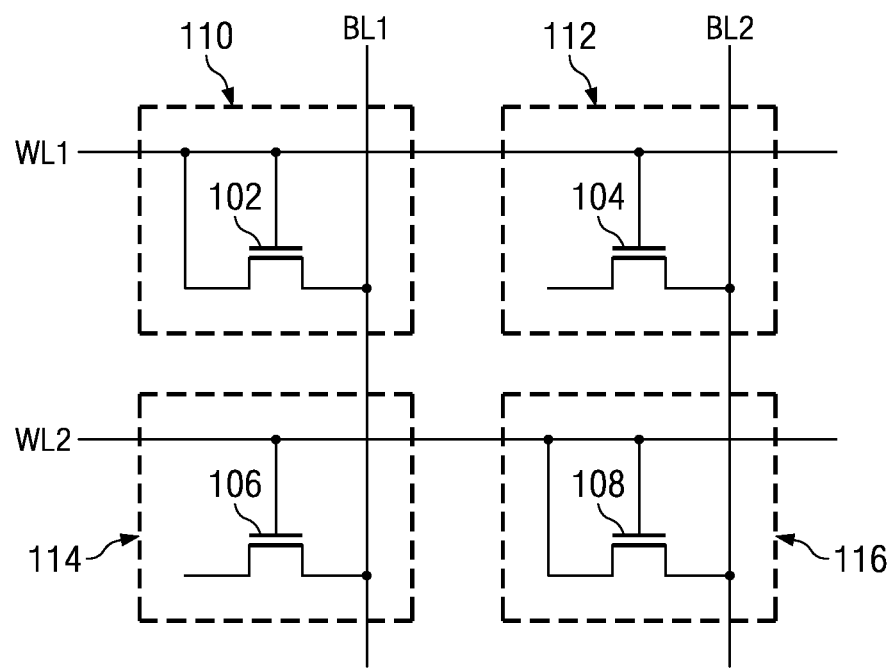
FIG. 2 is a schematic drawing of an embodiment of four non-volatile anti-fuse memory cells where two memory cells are programmed.

FIG. 2 is a schematic drawing of an embodiment of four non-volatile anti-fuse memory cells where two memory cells are programmed. In this example memory cells 110 and 116 have been programmed. A memory cell may be programmed by applying a high-voltage pulse not encountered during normal operation across the gate of a transistor (around 6V for a 3.5 nm thick oxide) to break down the insulator (e.g. oxide)

between the gate and the substrate. The positive voltage on the transistor's gate forms an inversion channel in the substrate below the gate, causing a tunneling current to flow through the insulator. The current produces additional traps in the oxide, increasing the current through the insulator and ultimately melting the insulator and forming a conductive channel from gate to substrate. The current required to form the drain diode is around 100 µA/100 nm$^2$ and the breakdown occurs in approximately 100 µs.

Memory cell 110 was programmed by applying 6 volts to word line WL1 and 0 volts to bit line BL1. After memory cell 110 was programmed, memory cell 116 was programmed by applying 6 volts to word line WL2 and 0 volts to bit line BL2. The rupture in the insulator of transistors 102 and 108 causes a drain to form in each. The drains of transistors 102 and 108 are connected to the gates of transistors 102 and 108 respectively.

Programmed memory cell 110 may be read by applying, for example, 1 volt on word line WL1. After one volt is applied to word line WL1, an n-type inversion layer is formed under the gate insulator of transistor 102. Because an n-type inversion layer is formed under the gate insulator of transistor 102 and the drain and gate of transistor 102 are electrically connected, an n-channel diode-connected transistor 102 is formed. N-channel diode-connected transistor 102 is turned on with 1 volt on the word line WL1 and zero volts on bit line BL1. Because N-channel diode-connected transistor 102 is turned on, current is conducted from word line WL1 through transistor 102 into bit line BL1. The current conducted through bit line BL1 is read (sensed) by a sense amp (not shown) at the end of the bit line BL1.

Programmed memory cell 116 may be read by applying, for example, 1 volt on word line WL2. After one volt is applied to word line WL2, an n-type inversion layer is formed under the gate insulator of transistor 108. Because an n-type inversion layer is formed under the gate insulator of transistor 108 and the drain and gate of transistor 108 are electrically connected, an n-channel diode-connected transistor 108 is formed. N-channel diode-connected transistor 108 is turned on with 1 volt on the word line WL2 and zero volts on bit line BL2. Because N-channel diode-connected transistor 108 is turned on, current is conducted from word line WL2 through transistor 108 into bit line BL2. The current conducted through bit line BL2 is read (sensed) by a sense amp (not shown) at the end of the bit line BL2.

Unprogrammed memory cells 112 and 114 will read a logical zero when they are read because they do not have a drain connected to a word line. Because unprogrammed memory cells 112 and 114 are not n-channel diode-connected transistors, they can not provide current to sense amps (not shown) on their bit lines.

Figure 3:
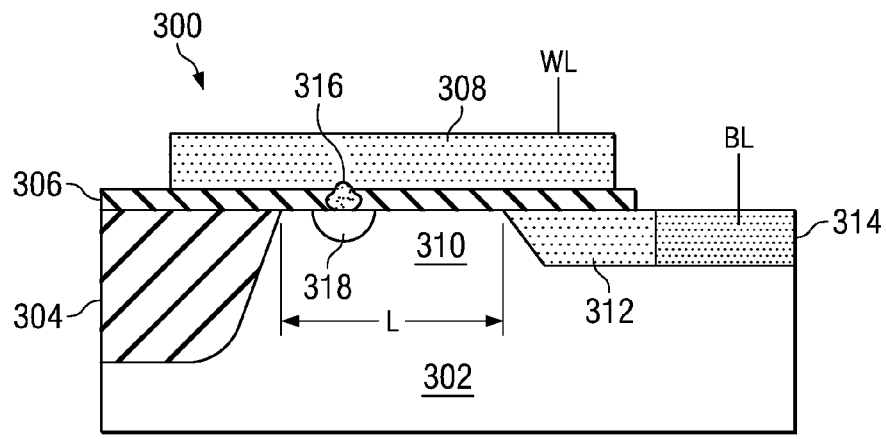
FIG. 3 is cross sectional view of an embodiment of a programmed n-channel diode-connected transistor with a rupture near the thick oxide.

FIG. 3 is cross sectional view of an embodiment of a programmed n-channel diode-connected transistor 300 with a rupture 316 near the swallow trench isolation (STI). In FIG. 3, the STI 304 is formed in a Pwell 302 along with a lightly n-type doped source 312 and a heavily n-type doped source 314. An insulator, in this example a thin oxide 306, is formed on top of the Pwell 302, STI 304, light doped source 312 and the heavily doped source 314. A channel 310 with a length L is formed between the STI and the lightly doped source 312. In this example, a uniformly doped n-type poly-silicon gate 308 is formed over the thin oxide 306. After applying the proper program voltage, a rupture 316 is formed through the thin oxide 306 near the STI 304 connecting the gate 308 and the drain 318 of the programmed n-channel diode-connected transistor 300.

The embodiment of a programmed n-channel diode-connected transistor 300 shown in FIG. 3 allows current to flow from the gate 308, through the rupture 316, through an n-type inversion channel (not shown), into the source 312 and out of source 314 when a positive voltage (e.g. 1 volt) is applied to the gate 308. The current flowing from source 314 may be sensed (read) by a sense amp (not shown). However, when a programmable n-channel diode-connected transistor is programmed and the rupture occurs near the source (shown in FIG. 4), a short may occur between a word line and a bit line rather than forming an n-channel diode-connected transistor 300 as shown in FIG. 3.

Figure 4:
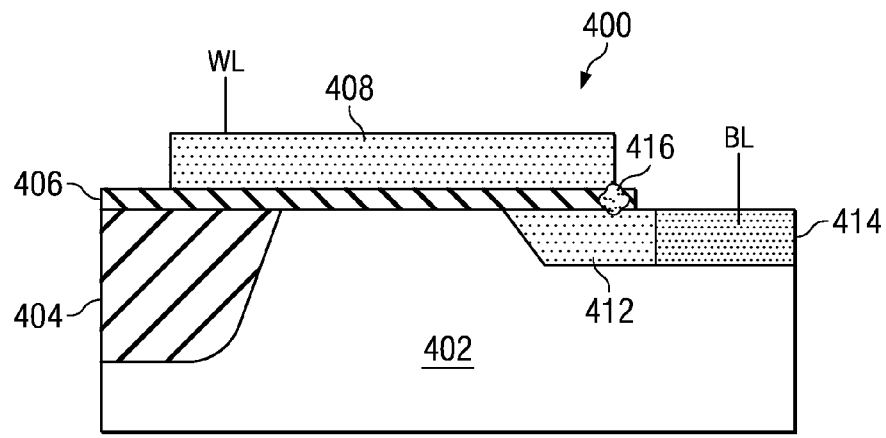
FIG. 4 is cross sectional view of an embodiment of a programmed n-channel diode-connected transistor where a rupture creates a short between the gate and the source.

In FIG. 4, the STI 404 is formed in a Pwell 402 along with a lightly n-type doped source 412 and a heavily n-type doped source 414. An insulator, in this example a thin oxide 406, is formed on top of the Pwell 402, STI 404 and the lightly doped source 412. In this example, a uniformly doped n-type poly-silicon gate 408 is formed over the thin oxide 406. After applying the proper program voltage, a rupture 416 is formed through the thin oxide 406 connecting the gate 408 and the lightly doped source 412. In this example a short occurs between the word line WL and the bit line BL rather than forming an n-channel diode-connected transistor 300 as shown in FIG. 3. Because the word line WL and the BL are shorted together, the memory cell fails to operate correctly.

Figure 5:
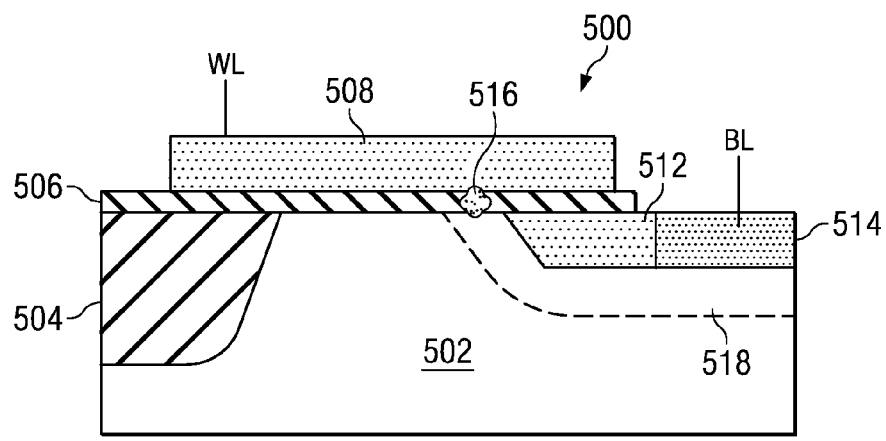
FIG. 5 is cross sectional view of an embodiment of a programmed n-channel diode-connected transistor where a rupture creates a highly resistive gate-to-drain diode connection rather than a low resistance gate-to-drain diode connection for the channel diode-connected transistor.

In FIG. 5, the STI 504 is formed in a Pwell 502 along with a lightly n-type doped source 512 and a heavily n-type doped source 514. An insulator, in this example a thin oxide 506, is formed on top of the Pwell 502, STI 504 and the lightly doped source 512. In this example, a uniformly doped n-type poly-silicon gate 508 is formed over the thin oxide 506. After applying a proper program voltage, a rupture 516 is formed through the thin oxide 506 connecting the gate 508 and a "halo" region 518. In this example, a halo region is a region that is more highly doped near the sources 512 and 514. The concentration in the halo region becomes lighter as the distance increases away from the sources 512 and 514.

In the example shown in FIG. 5, the programmed n-channel diode-connected transistor is incompletely blown. Because a programmed n-channel diode-connected transistor is incompletely blown, a high resistive path (e.g. 1×10$^9$ ohms) is created between the gate 508 and the source 512. As a result, the amount of current drawn through the resistive path is small. Because the amount of current drawn through the resistive path is small, the current is difficult to sense and the memory cell fails to operate properly.

Figure 6A:
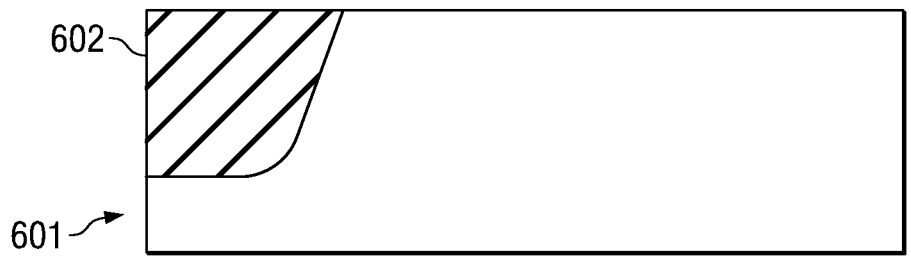
FIGS. 6A-6H are cross-sectional views of an embodiment of a process for making a programmable n-channel diode-connectable transistor.
Figure 6B:
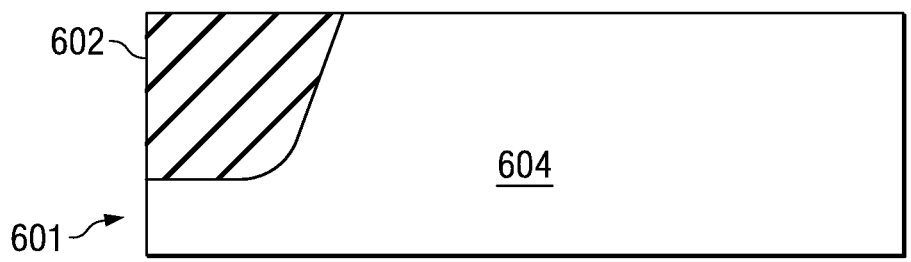
Figure 6C:
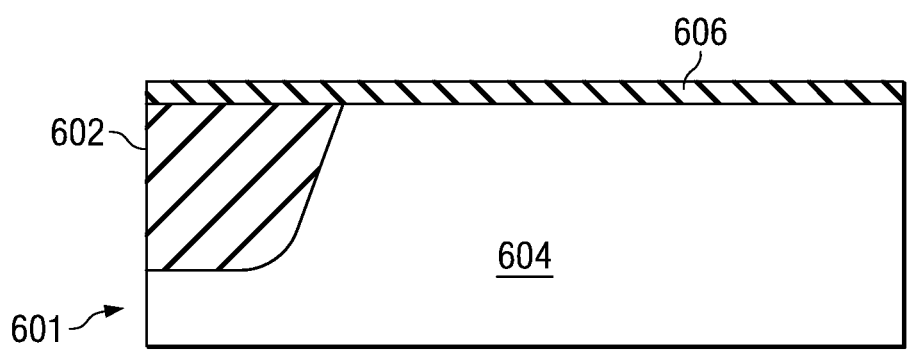

FIGS. 6A-6H are cross-sectional views of an embodiment of a process for making a programmable n-channel diode-connectable transistor. The first cross-sectional view shown in FIG. 6A shows a thick oxide region 602 formed in the substrate 601. In this example a swallow-trench isolation (STI) is used to form the thick oxide region 602. However, in another embodiment local oxidation of silicon (locos) may be used to form the thick oxide region 602. The second cross-sectional view shown in FIG. 6B illustrates a Pwell 604 implanted into the substrate 601. The third cross-sectional view shown in FIG. 6C illustrates an insulation region 606 grown on the Pwell region 604 and on the thick oxide region 602. The insulation region 606 may comprise an oxide, a nitride and a combination of an oxide and nitride, for example. The insulation region 606 may also be a high K dielectric insulator.

Figure 6D:
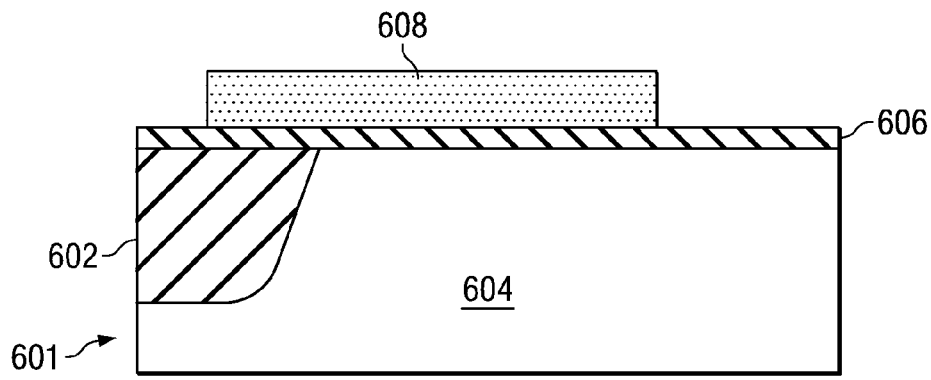
Figure 6E:
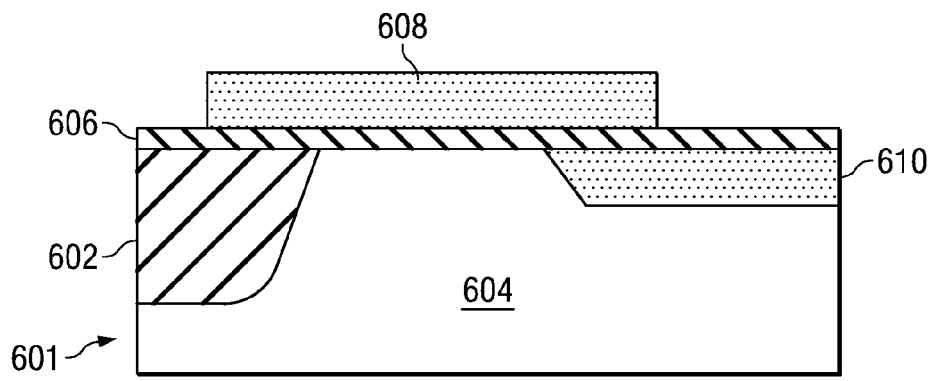
Figure 6F:
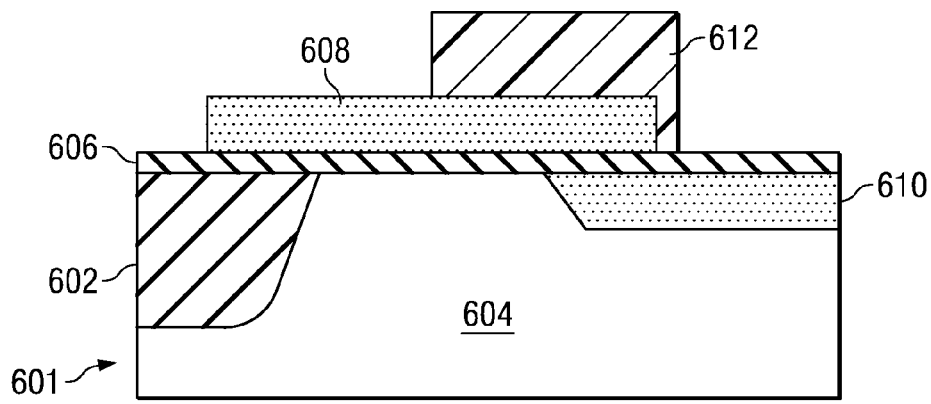

After the insulation region 606 is grown, a poly-silicon layer is deposited over the insulation region 606. The poly-silicon layer is then etched to form a poly-silicon gate 608 as shown in FIG. 6D. In FIG. 6E, a first concentration of n-type dopant is implanted into the gate 608 and a portion of the Pwell. The portion of the Pwell implanted with the first concentration becomes a source 610 for the programmable n-channel diode-connectable transistor. In one embodiment, the first concentration of n-type dopant is lightly doped (e.g. $5\times10^{18}$ cm$^{-3}$). After the first concentration of doping has been implanted, a mask 612 is formed by depositing and etching photo-resist (see FIG. 6F). The mask 612 covers a portion of the gate 608, a portion of the insulator 606, and a portion of the source 610.

After the mask 612 is formed, a second concentration of n-type doping is implanted into the areas not covered by the mask 612. In one embodiment, the second concentration of n-type dopant is higher (e.g. $5\times10^{20}$ cm$^{-3}$) than the first concentration. In this example, the second concentration is 2 orders of magnitude greater than the first concentration. In another embodiment, the first and second concentrations may be different while maintaining a difference in concentrations of approximately one order of magnitude.

Figure 6G:
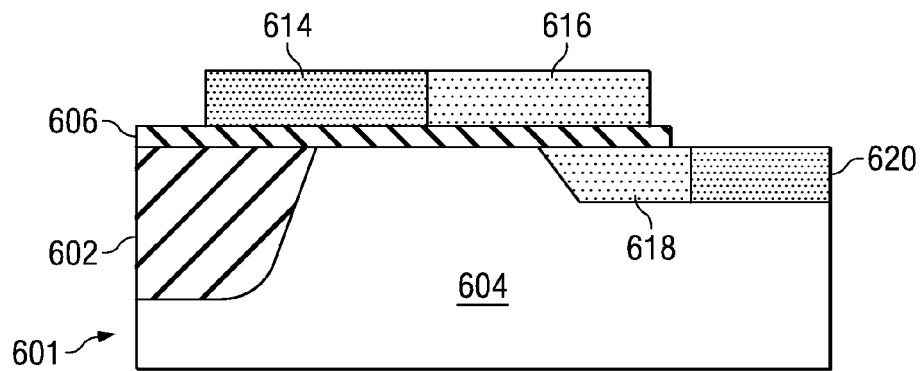

FIG. 6G illustrates that the mask 612 has been removed from the gate 608, the insulator 606, and the source 610. Because two different n-type doping concentrations have been used, portions of the gate and source have different concentrations of n-type doping. In this example, a first portion 614 of the gate is more heavily doped than a second portion 616 of the gate. Also in this example, a first portion 618 of the source is more lightly doped than a second portion 620 of the source.

Figure 6H:
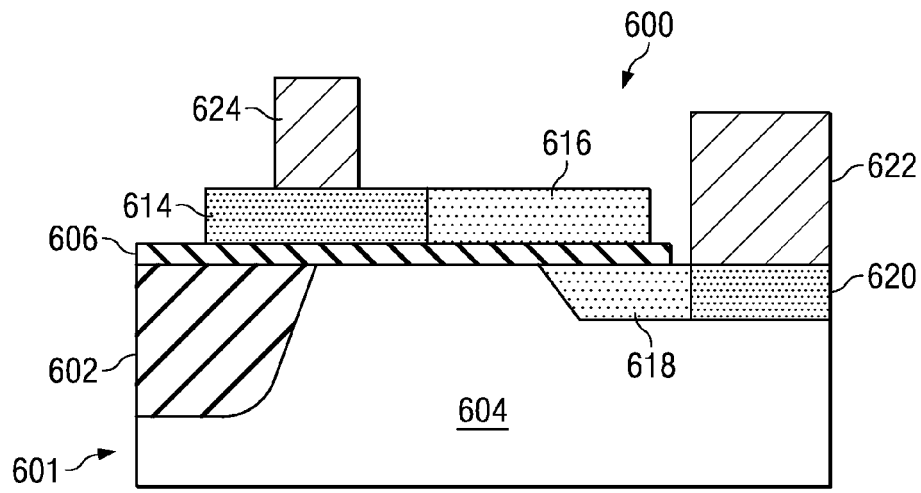

FIG. 6H illustrates a part of the process where an electrical connection 624 is made to the heavily doped gate portion 614 and where an electrical connection 622 is made to the heavily doped source portion 620. The electrical connections 622 and 624 are usually metal connections. Metal connection 624 may be used as a word line in a memory cell and metal connection 622 may be used as a bit line in a memory cell. The device shown in FIG. 6H is a programmable n-channel diode-connectable transistor. Using a similar process as shown in FIGS. 6A-6H, a programmable p-channel diode-connectable transistor may be formed. An example of a p-channel programmable diode-connectable transistor will be discussed in more detail later in the specification.

In the previous embodiment of an n-channel programmable diode-connectable transistor, the first and second doping concentrations were n-type dopants; the first concentration being more lightly doped than the second concentration. However, counter-doping may be used to form regions with higher and lower n-type doping concentrations. For example, gate 608 may be highly doped (e.g. $5\times10^{20}$ cm$^{-3}$) to start and later portion 616 of the gate 608 may be counter-doped with a p-type material to reduce the n-type doping in that portion 616.

Figure 7:
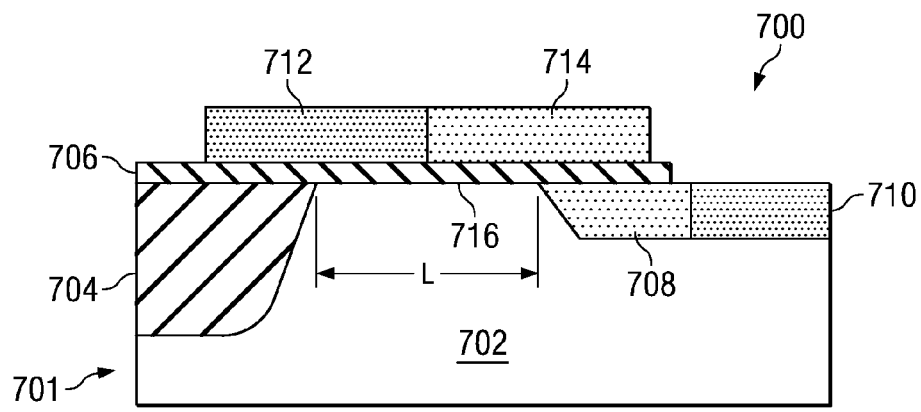
FIG. 7 is cross sectional view of an embodiment of a programmed p-channel diode-connectable transistor.

FIG. 7 is cross sectional view of an embodiment of a programmable p-channel diode-connectable transistor 700. In FIG. 7, the STI 704 is formed in an Nwell 702 along with a lightly p-type doped source 708 and a heavily p-type doped source 710. An insulator, in this example a thin oxide 706, is formed on top of the Nwell 702, STI 704, lightly doped source 708 and the heavily doped source 710. A channel 716 with a length L is formed between the STI 704 and the lightly doped source 708. In this example, the gate has two portions. A first portion 712 is more heavily p-type doped than the second portion 714. Because the first portion is more heavily p-type doped, when the programmable p-channel diode-connectable transistor 700 is programmed, a rupture is more likely to occur near the STI 704 than the source 708. Because the rupture is more likely to occur near the STI 704 than the source 708, it is more likely that a programmed p-channel diode-connected transistor will be formed when the rupture occurs.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

The invention claimed is:

1. A system comprising:
at least one integrated circuit, the at least one integrated circuit comprising:
at least one non-volatile anti-fuse memory cell, the at least one non-volatile anti-fuse memory cell comprising:
at least one programmable n-channel diode-connectable transistor comprising:
a poly-silicon gate over a channel region, the poly-silicon gate having a first portion and a second portion wherein the first portion of the gate is electrically connected to a word line of the memory cell; wherein the channel region has a length and is located in a Pwell;
an n-type source region formed in the Pwell region, the n-type source region having a first portion and a second portion wherein the first portion of the source region is proximate to a first end of the channel region and the second portion of the source region is electrically connected to a bit line of the memory cell;
a field oxide region formed in the Pwell region, the field oxide proximate to a second end of the channel region;
an insulator having a substantially constant thickness located between the poly-silicon gate and the channel region;
wherein the poly-silicon gate is doped n-type, the first portion of the poly-silicon gate having a higher n-type doping concentration than the second portion of the poly-silicon gate, the second portion of the poly-silicon gate proximate to the first portion of the source;
wherein when the non-volatile anti-fuse memory cell is programmed, a rupture occurs between the first portion of the poly-silicon gate and the channel region proximate to the field oxide region.

2. The system of claim 1 wherein the system is selected from a group consisting of a video game console, a mobile phone, a radio-frequency identification tag, an implantable medical device, a high-definition multimedia interface and an automotive electronics device.

* * * * *